United States Patent
Cho et al.

(10) Patent No.: US 12,176,950 B2
(45) Date of Patent: *Dec. 24, 2024

(54) TEST DEVICE AND TEST METHOD FOR DFB-LD FOR ROF SYSTEM

(71) Applicant: ELECTRONICS AND TELECOMMUNICATIONS RESEARCH INSTITUTE, Daejeon (KR)

(72) Inventors: Seung-Hyun Cho, Sejong-si (KR); Joon Ki Lee, Sejong-si (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/389,942

(22) Filed: Dec. 20, 2023

(65) Prior Publication Data

US 2024/0121002 A1    Apr. 11, 2024

Related U.S. Application Data

(63) Continuation of application No. 17/846,604, filed on Jun. 22, 2022, now Pat. No. 11,949,453.

(30) Foreign Application Priority Data

Jun. 25, 2021 (KR) .......... 10-2021-0083289
Dec. 9, 2021 (KR) .......... 10-2021-0175822

(51) Int. Cl.
*H04B 10/07* (2013.01)
*H04B 10/077* (2013.01)
*H04B 10/2575* (2013.01)

(52) U.S. Cl.
CPC ....... *H04B 10/2575* (2013.01); *H04B 10/077* (2013.01); *H04B 10/07* (2013.01)

(58) Field of Classification Search
None
See application file for complete search history.

(56) References Cited

U.S. PATENT DOCUMENTS 6,629,638 B1 * 10/2003 Sanchez ............ G01R 31/002
                                                        235/455
7,182,510 B2 *  2/2007 Cahill .................. G01N 25/18
                                                        703/2

(Continued)

OTHER PUBLICATIONS

Rick Manderscheid, "1st Level Qualification for Optical Devices," CISCO, (Apr. 15, 2010).

(Continued)

*Primary Examiner* — Jai M Lee
(74) *Attorney, Agent, or Firm* — LRK PATENT LAW FIRM (57) ABSTRACT

A test device and method for testing a distributed feedback laser diode (DFB-LD) device for an optical transceiver of a radio over fiber (RoF) system examines the DFB-LD device based on an absolute limiting rating, an operating case environment, and a functional specification, in which the absolute limiting rating is a rating at which there is no fatal damage to the DFB-LD device during a short period of time when each limiting parameter is isolated and all other parameters are in a normal performance parameter, the operating case environment includes an operating temperature, and the functional specification includes parameters to be tested according to an operating condition for the functional specification.

14 Claims, 6 Drawing Sheets

(56) References Cited

U.S. PATENT DOCUMENTS

| | | | | |
|---|---|---|---|---|
| 7,711,265 B2* | 5/2010 | Inman | | H04L 1/205 |
| | | | | 398/24 |
| 7,954,358 B2* | 6/2011 | Lerner | | H01S 5/0683 |
| | | | | 73/1.01 |
| 8,583,395 B2* | 11/2013 | Dybsetter | | H04B 10/40 |
| | | | | 702/119 |
| 9,065,571 B2* | 6/2015 | Levinson | | H04B 10/40 |
| 9,184,850 B2* | 11/2015 | Aronson | | G01M 11/30 |
| 9,391,718 B2* | 7/2016 | Rope | | H04B 17/309 |
| 9,455,550 B2 | 9/2016 | Uetsuji et al. | | |
| 9,602,897 B2* | 3/2017 | Coffey | | G02B 6/3825 |
| 10,200,125 B2 | 2/2019 | Cho et al. | | |
| 11,949,453 B2* | 4/2024 | Cho | | H04B 10/077 |
| 2001/0026572 A1* | 10/2001 | Shimizu | | G01R 31/2635 |
| | | | | 372/45.01 |
| 2003/0219051 A1* | 11/2003 | Hsieh | | H01S 5/06209 |
| | | | | 372/38.02 |
| 2004/0019459 A1* | 1/2004 | Dietz | | G01M 11/335 |
| | | | | 702/184 |
| 2004/0052299 A1* | 3/2004 | Jay | | G01M 11/335 |
| | | | | 374/1 |
| 2005/0121632 A1* | 6/2005 | Chieng | | H01S 5/06804 |
| | | | | 250/559.1 |
| 2014/0334512 A1 | 11/2014 | Kwon et al. | | |
| 2015/0110144 A1 | 4/2015 | Kwon et al. | | |
| 2016/0013621 A1 | 1/2016 | Leem et al. | | |

OTHER PUBLICATIONS

George Zhong, "Preliminary Specification of 1.27um~1.61um CWDM MQW-DFB Laser Diode Module: Analog CWDM of less than 2GHZ application," Eoptolink Technology Inc., Ltd, (Apr. 12, 2016).

* cited by examiner

FIG. 1

| Parameter | Symbol | Value | | Unit |
|---|---|---|---|---|
| | | Minimum | Maximum | |
| Operating case temperature | $T_c$ | -20 | +60 | °C |

FIG. 2

| | Parameter | Symbol | Conditions | Rating | Unit |
|---|---|---|---|---|---|
| Laser diode | Optical ouput power from fibre end | $P_f$ | CW | 10 | mW |
| | Forward current | $I_f$ | CW | 150 | mA |
| | Reverse voltage | $V_{rl}$ | - | 2 | V |
| Photodiode | Forward current | $I_{fd}$ | - | 2 | mA |
| | Reverse voltage | $V_{rd}$ | - | 20 | V |
| Operating case temperature | | $T_c$ | - | -20 to 60 | °C |
| Storage temperature | | $T_{stg}$ | - | -40 to 85 | °C |

FIG. 3

| Parameter | Symbol | Value | Unit |
|---|---|---|---|
| Operating case temperature | $T_c$ | 25 | °C |

FIG. 4

| Parameter | Symbol | Test condition | Limits | | | Unit |
|---|---|---|---|---|---|---|
| | | | Minimum | Typical | Maximum | |
| Treshold current | $I_{th}$ | CW | - | 8 | 15 | mA |
| Optical ouput power at threshold current | $P_{th}$ | CW, $I_{bias}=I_{th}$ | - | - | 100 | µW |
| Operating current | $I_{op}$ | CW, $P_f$=4mW | - | - | 60 | mA |
| Operating voltage | $V_{op}$ | CW, $P_f$=4mW | - | 1.2 | 1.6 | V |
| Slope efficiency | $\eta$ | CW, $P_f$=4mW | 0.08 | 0.13 | 0.23 | W/A |
| Delta slope efficiency | $\Delta\eta$ | CW, $P_f$=4mW $T_c$=60°C | 40 | 60 | - | % |
| Light-emission current wavelength[b] | $\lambda_c$ | CW, APC[a] | $\lambda_c$-5 | $\lambda_c$ | $\lambda_c$+5 | nm |
| Wavelenght temperature coefficient | $\lambda_{ct}$ | CW, APC | - | 0.1 | 0.11 | nm/°C |
| Side mode suppression ratio | $S_r$ | CW, APC | 30 | 45 | - | dB |
| Tracking error[c] | $E_r$ | CW, APC | 0.5 | - | 1.25 | dB |
| Monitor current | $I_m$ | CW, $P_f$=4mW, $V_{rd}$=5V | 0.1 | - | 1.5 | mA |
| Dark current | $I_d$ | $V_{rd}$=5V | - | - | 0.1 | µA |
| Relative intensity noise (RIN) | - | CW, APC, f=4900MHz | -165 | - | -145 | dB/Hz |
| Third order inter-modulation distortion (IMD3) | - | Two-tone test f=4900MHz $f_2$=5000MHz OMU 20%[d], $P_f$=4mW | - | - | -60 | dBc | a APC (automatic power comtrol) refers to operting the laser diode in such a way that the monitor photodiode current is constant for $P_f$=4mW at $T_c$=25°C
b CWDM wavelength (ITU Recommendation G.694.2)
c $E_r$=max|10log[$P_f(T_c)/P_f(T_c=25°C)$]|
d Optical modulation index

FIG. 5

| No. | Test | Reference | Conditions | Number of samples |
|---|---|---|---|---|
| 1 | Endurance test of: | | | |
| 1.1 | Package | | | |
| 1.1.1 | High temperature storage | IEC 60749-6 | Temperature: $T=T_{stg\,max}$<br>Duration:1000h<br>Temperature: $T=T_{stg\,min}$ | 11 |
| 1.1.2 | Low temperature storage | | Temperature: $T=T_{stg\,min}$<br>Duration>2000h | 11 |
| 1.1.3 | Temperature cycling | IEC 60749-25 | Temperature: $T=T_{stg\,min}$<br>$T_B=T_{stg\,max}$<br>Number of cycles=100 | 11 |
| 1.1.4 | Damp heat | IEC 61300-2-19 | T=+40°C±2°C<br>RH:93%+2%/-3%<br>96h duration | 11 |
| 1.1.5 | Temperature-humidity cycling | IEC 61300-2-48, method A | -40°C±2°C to +85°C±2°C<br>85±5% RH at the maximum temperature<br>1hour minimum duration at extremes<br>≥1°C/min rate of change<br>42cycles | 11 |
| 1.1.6 | Fibre pull[a] | IEC 61300-2-4 | Force:5N±0.5N,<br>Rate of force to 5N:0.5N/s<br>60s duration for buffered fibres | 11 |
| 1.2 | Laser diode (submount) | | Temperature: at least two test temperature:<br>φe specifid, constant power<br>$T_{s1}=T_{s\,max}$<br>$T_{s2}=<(T_{s1}-20°C)$<br>Duration:>5000h | b |
| 1.3 | Photodiode (in representative package) | | Temperature: at least two test temperatures:<br>$V_{rl}$ or $I_{rl}$ specified<br>$T_{s1}=125°C$ min.<br>$T_{s2}≤(T_{s1}-30°C)$<br>Duration:>1000h | b |
| 2 | Mechanical shock | IEC 60749-10 | 1500G, 0.5ms<br>5 times/axis | 11 |
| 3 | Vibration | IEC 60749-12 | 20G, 20Hz to 2000Hz,<br>4min/cycle, 4cycle/axis | 11 |
| 4 | Rapid change of temperature | IEC 60749-11 | ΔT=100°C, Temperature change time <10s, dwell time> 2min. Temperature reach time< 5min. 15cycles | 11 |
| 5 | ESD | IEC 60749-26 | Human body model, positive and negative voltage pulses with a pulse interval of 300ms | 3 |
| 6 | Internal moisture | IEC 60749-7 | ≤5000x10⁻⁶ water vapor | 11 | a Applied to fibre pigtailed packages.
b These parameters can be determined from negotiations between manufacturer and user.

FIG. 6

| Devices | Parameter | Failure vriterion | Measurement condition |
|---|---|---|---|
| Laser diode | Operating current | 50% increase [a] | 25°C or life test temperature |
| | Slope efficiency | 10% change [a] | 25°C or life test temperature |
| | Forward voltage | 10% change [a] | 25°C or life test temperature |
| | Kinks in L/I curve | Kink-free within $1.2 \times P_f$ (linearity change≤10%) [a] | $T_c$ minimum, 25°C, and $T_c$ maximum |
| Photodiode | Dark current | USL or 10nA increase | 25°C |
| Laser package | Operating current | 50% increase [a] | 25°C or life test temperature |
| | Fibre or connector output power | 10% change | Life test temperature $I_m$ set to initial value |
| | Kinks in L/I curve | Kink-free within $1.2 \times P_f$ (linearity change≤10%) [a] | $T_c$ minimum, 25°C, and $T_c$ maximum |
| | Tracking ratio ($I_m/P_f$) | <LSL≥USL | $T_c$ minimum~$T_c$ maximum At rated power level 25°C |
| | Photodiode dark current | USL or 10nA increase [a] | |
| a Change of pre-and post-test values in the DS. | | | |

FIG. 7

TEST DEVICE AND TEST METHOD FOR DFB-LD FOR ROF SYSTEM

CROSS-REFERENCE TO RELATED APPLICATIONS

This application is a continuation of U.S. patent application Ser. No. 17/846,604, filed on Jun. 22, 2022, which claims the benefit of Korean Patent Application No. 10-2021-0083289 filed on Jun. 25, 2021, and Korean Patent Application No. 10-2021-0175822 filed on Dec. 9, 2021, in the Korean Intellectual Property Office, the entire disclosures of which are incorporated herein by reference for all purposes.

BACKGROUND

One or more example embodiments relate to a test device and method for testing a distributed feedback laser diode (DFB-LD) for a radio over fiber (RoF) system. This device may convert an electrical radio signal into an optical signal.

SUMMARY

According to an example embodiment, there is provided a test device for testing a distributed feedback laser diode (DFB-LD) device for an optical transceiver of a radio over fiber (RoF) system. The test device may test the DFB-LD device based on an absolute limiting rating, an operating case environment, and a functional specification. The absolute limiting rating may refer to a rating at which there is no fatal damage to the DFB-LD device during a preset period of time when each limiting parameter is isolated and all other parameters are in a normal performance parameter. The operating case environment may include an operating temperature, and the functional specification may include a parameter to be tested according to each operating condition.

The operating condition for the functional specification may include an environmental temperature and a case temperature.

The parameters for the functional specification may include: (i) a threshold current, (ii) an optical output power at the threshold current, (iii) an operating current, (iv) an operating voltage, (v) a slope efficiency, (vi) a delta slope efficiency, (vii) a light-emission current wavelength, (viii) a wavelength temperature coefficient, (ix) a side mode suppression ratio, (x) a tracking error, (xi) a monitor current, (xii) a dark current, (xiii) a relative intensity noise, and (xiv) a third-order intermodulation distortion.

The test on the DFB-LD device may be performed under test plans: (i) a package, (ii) first temperature storage, (iii) second temperature storage, (iv) temperature cycling, (v) damp heat, (vi) temperature-humidity cycling, (vii) fiber pull, (viii) a laser diode sub-mount, (ix) a photodiode in a representative package, (x) a mechanical impact, (ix) vibration, (xii) a drastic temperature change, (xiii) an electrostatic discharge (ESD), and (xiv) an internal humidity.

A laser diode of the DFB-LD device may be tested according to an operating current, a slope efficiency, a forward voltage, and a kink on a light-current (L/I) curve.

A photodiode of the DFB-LD device may be tested according to a dark current.

A laser package of the DFB-LD device may be tested according to (i) an operating current, (ii) fiber or connector output power, (iii) a kink on an L/I curve, (iv) a tracking error, and (v) a photodiode dark current.

According to an example embodiment, there is provided a test method of testing a DFB-LD device for an optical transceiver of an RoF system. The test method may include identifying the DFB-LD device, and testing the DFB-LD device based on an absolute limiting rating, an operating case environment, and a functional specification. The absolute limiting rating may refer to a rating at which there is no fatal damage to the DFB-LD device during a preset period of time when each limiting parameter is isolated and all other parameters are in a normal performance parameter. The operating case environment may include an operating temperature, and the functional specification may include parameters to be tested according to an operating condition for the functional specification.

The operating condition for the functional specification may include an environmental temperature and a case temperature.

The parameters for the functional specification may include: (i) a threshold current, (ii) an optical output power at the threshold current, (iii) an operating current, (iv) an operating voltage, (v) a slope efficiency, (vi) a delta slope efficiency, (vii) a light-emission current wavelength, (viii) a wavelength temperature coefficient, (ix) a side mode suppression ratio, (x) a tracking error, (xi) a monitor current, (xii) a dark current, (xiii) a relative intensity noise, and (xiv) a third-order intermodulation distortion.

The test on the DFB-LD device may be performed under test plans: (i) a package, (ii) first temperature storage, (iii) second temperature storage, (iv) temperature cycling, (v) damp heat, (vi) temperature-humidity cycling, (vii) fiber pull, (viii) a laser diode sub-mount, (ix) a photodiode in a representative package, (x) a mechanical impact, (ix) vibration, (xii) a drastic temperature change, (xiii) ESD, and (xiv) an internal humidity.

A laser diode of the DFB-LD device may be tested according to an operating current, a slope efficiency, a forward voltage, and a kink on a L/I curve.

A photodiode of the DFB-LD device may be tested according to a dark current.

A laser package of the DFB-LD device may be tested according to (i) an operating current, (ii) fiber or connector output power, (iii) a kink on an L/I curve, (iv) a tracking error, and (v) a photodiode dark current.

According to example embodiments described herein, it is possible to effectively test a network device including a distributed feedback laser diode (DFB-LD) used for a radio over fiber (RoF) system.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

The following structural or functional descriptions of example embodiments described herein are merely intended for the purpose of describing the example embodiments described herein and may be implemented in various forms. However, it should be understood that these example embodiments are not construed as limited to the illustrated forms. Various modifications may be made to the example embodiments. Here, the example embodiments are not construed as limited to the disclosure and should be understood to include all changes, equivalents, and replacements within the idea and the technical scope of the disclosure.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present disclosure.

When it is mentioned that one component is "connected" or "accessed" to another component, it may be understood that the one component is directly connected or accessed to another component or that still other component is interposed between the two components. In addition, it should be noted that if it is described in the specification that one component is "directly connected" or "directly joined" to another component, still other component may not be present therebetween. Likewise, expressions, for example, "between" and "immediately between" and "adjacent to" and "immediately adjacent to" may also be construed as described in the foregoing.

The terminology used herein is for the purpose of describing particular example embodiments only and is not to be limiting of the example embodiments. As used herein, the singular forms "a," "an," and "the" are intended to include the plural forms as well, unless the context clearly indicates otherwise. As used herein, the term "and/or" includes any one and any combination of any two or more of the associated listed items. It will be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined herein, all terms used herein including technical or scientific terms have the same meanings as those generally understood by one of ordinary skill in the art. Terms defined in dictionaries generally used should be construed to have meanings matching contextual meanings in the related art and are not to be construed as an ideal or excessively formal meaning unless otherwise defined herein.

Hereinafter, example embodiments will be described in detail with reference to the accompanying drawings. When describing the example embodiments with reference to the accompanying drawings, like reference numerals refer to like components and a repeated description related thereto will be omitted.

Figure 1:
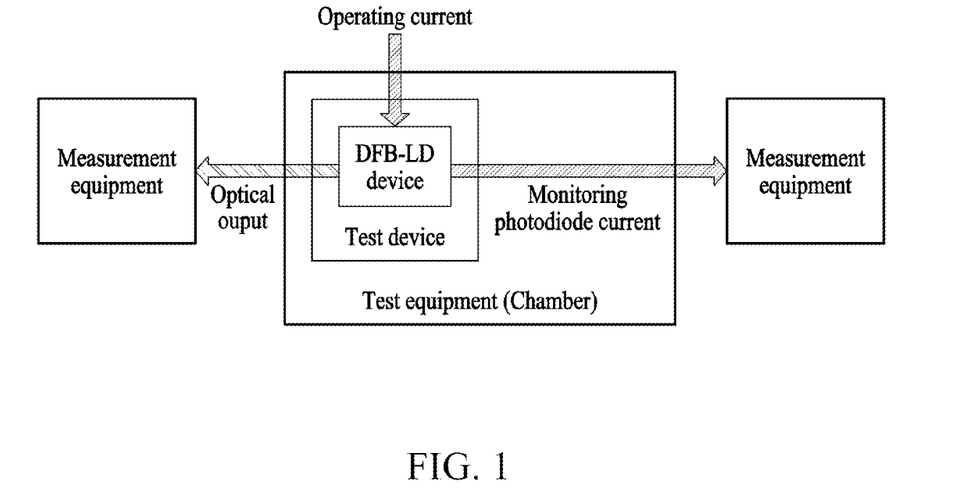
FIG. 1 illustrates an example of a network device and a test device according to an example embodiment.

FIG. 1 illustrates an example of a network device and a test device according to an example embodiment.

According to an example embodiment, a distributed feedback laser diode (DFB-LD) device for a radio over fiber (RoF) system may convert an electrical radio signal into an optical signal.

The DFB-LD device may provide optical and electrical performance specifications for implementing an RoF transceiver. The RoF transceiver may be required to operate the RoF system that requires an optical source such as the DFB-LD device. To ensure the performance and reliability of the DFB-LD device for the RoF transceiver, a test may be required. Hereinafter, a series of tests and measurements including conditions, severity, and pass/fail criteria for the DFB-LD device will be described, along with product performance requirements. A process of the test may be performed one time to demonstrate all the capabilities of the DFB-LD device that meet performance standard requirements. A product that is proved to meet all the performance standard requirements may be determined to comply with the performance standards, yet may need to be managed by a quality assurance/quality compliance program.

According to an example embodiment, there is provided a test device configured to examine a DFB-LD device for an optical transceiver of an RoF system. The test device may input a current to the DFB-LD device, and measure an optical output and a PD current output for monitoring, for which the test device may be connected to an external measuring instrument. The DFB-LD device may be disposed in a test facility, and the test device may perform a test on the DFB-LD device while changing operating conditions in the test facility. For example, the test device may perform the test on the DFB-LD device based on an absolute limiting rating, an operating case environment, and a functional specification. In this example, the absolute limiting rating may refer to a rating at which there is no fatal damage to the DFB-LD device during a preset period of time when each limiting parameter is isolated and all other parameters are in a normal performance parameter. The operating case environment may include an operating temperature. The functional specification may include a parameter to be tested according to each operating condition. Terms used herein are defined as follows.

(1) Light-Emission Central Wavelength

A light-emission central wavelength of a DFB-LD device through an optical fiber system when it operates under a general operating condition.

(2) Relative Intensity Noise

A degree of uncertainty of a power level of a laser output power which is noise normalized to an average power level.

(3) Third-Order Intermodulation Distortion

An amplitude modulation of a signal including two or more different frequencies by system nonlinearity or time variation. Each individual signal including an original signal (f1 and f2) and a second-order intermodulation product (f1+f2, f2−f1, 2f1, and 2f2) may be added or subtracted to or from each other to generate more signals. There may be two intermodulation products—2f1−f2 and 2f2−f1—which may cause interference because they are close to the original signal.

DFB-LD for RoF amplitude modulation of signals containing two or more different frequencies, caused by non-linearities or time variance in a system. Each individual signal frequency, including original signals at frequencies $f_1$ and $f_2$ and the second-order intermodulation products at $f_1+f_2$, $|f_2-f_1|$, $2f_1$ and $2f_2$, will add to and subtract from other frequency components to give rise to more signal components. The two intermodulation products at frequencies $|2f_1-f_2|$ and $|2f_2-f_1|$ in particular can be troublesome and can cause interference, as their frequencies are close to the frequencies of the original signals.

(4) Frequency Response

It is used to quantitatively measure an output spectrum of a system or device in response to a stimulus and characterize the dynamics of the system.

Figure 2:
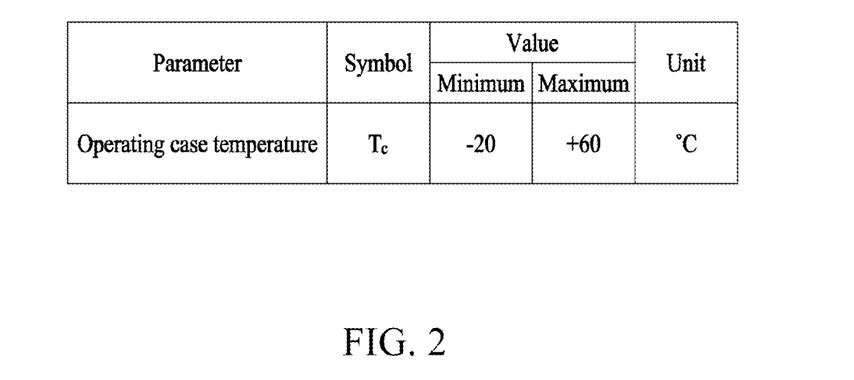
FIG. 2 illustrates an example of a parameter of an operating temperature according to an example embodiment.

Parameters used herein may be defined as follows.
$P_f$ Optical output power
$I_f$ Forward current
$V_{rl}$ Reverse voltage for laser diode
$T_c$ Operating case temperature
$I_{th}$ Threshold current
$P_{th}$ Optical output power at threshold current
$I_{op}$ Operating current
$V_{op}$ Operating voltage
$\eta$ Slope efficiency
$\Delta\eta$ Delta slope efficiency
$\lambda c$ Light-emission central wavelength
$\lambda ct$ Wavelength temperature coefficient
$S_r$ Side mode suppression ratio
$I_{th}$ Threshold current
$E_r$ Tracking error
$I_m$ Monitor current
$I_d$ Dark current
RIN Relative intensity noise
IMD3 Third-order inter-modulation distortion
$I_{fd}$ forward current for photodiode
$I_{rl}$ reverse current for photodiode
$T_{stg}$ storage temperature
$V_{rd}$ reverse voltage for photodiode Abbreviated terms used herein may be defined as follows.
APC automatic power control
A-RoF analogue radio over fibre
CW continuous wave
CWDM coarse wavelength division multiplexing
DFB-LD distributed feedback laser diode
DS data sheet
LSL lower specification limit
OMI optical modulation index
RH relative humidity
RoF radio over fibre
USL upper specification limit FIG. 2 illustrates an example of an operation of a test device according to an example embodiment.

Parameters to be applied by a test device to a DFB-LD device may be described as follows.

(1) Absolute Limiting (Maximum/Minimum) Ratings

It may indicate that there is no fatal damage when each limiting parameter is isolated and all other parameter values are in a normal performance parameter, and a product is applied to such a rating for a short period of time. It may not be assumed that limiting values of two or more parameters are applicable at once. The absolute limiting rating will be described in detail later.

In other words, absolute limiting (maximum and/or minimum) ratings imply that no catastrophic damage will occur if the product is subject to these ratings for short periods of time, provided each limiting parameter is in isolation and all other parameters have values within the normal performance parameters. It should not be assumed that the limiting value of more than one parameter can be applied at any one time.

(2) Operating Case Environment

FIG. 2 illustrates an operating case environment of a test device including a temperature range in particular.

Once build criteria are completed and frozen, initial characterization and qualification tests need to be performed. The qualification of a DFB-LD device may be maintained using a periodic test program. A test condition for all the tests may include a temperature condition indicating a temperature of 25° C. with an error tolerance of 2° C.

<Characterization Testing>

Characterization may need to be performed on at least 20 products brought from at least three different manufacturing lots. The characteristics and conditions for a DFB-LD device for an RoF system may be tested at an operating temperature and an operating current to meet a functional specification for the DFB-LD device.

Performance Test

A performance test may be performed when a characterization test is completed. A performance test plan and a recommended performance test failure criterion will be described hereinafter.

Environmental Specification (1) General Safety

A DFB-LD device needs to comply with IEC 60950-1.

(2) Laser Safety

An optical transceiver and a transceiver that use a DFB-LD device may need to receive class 3R laser certification under all operating conditions which include a single fault condition from a connection to an optical cable or an open bore. The DFB-LD device may need to receive the certification according to a device classification, requirements, and user guide for an optical fiber transmitter and transceiver. Laser safety standards and regulations require product manufacturers to provide information about lasers, safety features, labeling, usage, maintenance and repair, and services of their products. It is necessary to explicitly define the requirements and usage restrictions on a host system to meet the safety certification.

In other words, Fibre optic active device including DFB-LD specified in this document shall be class 3R laser certified under any condition of operation. This includes single fault conditions whether coupled into a fibre or out of an open bore. DFB-LD device specified in this document shall be certified. Laser safety standards and regulations require that the manufacturer of a laser product provide information about the product's laser, safety features, labelling, use, maintenance and service. This documentation shall explicitly define requirements and usage restrictions on the host system necessary to meet these safety certifications (3) Electromagnetic Compatibility (EMC) Requirements A DFB-LD may need to comply with appropriate requirements for EMC (both radiation and immunity) according to a specific application/environment in which it is to be installed or integrated.

Hereinafter, specifications for a DFB-LD device in an RoF system will be described.

In other works, Products defined in this specification shall comply with suitable requirements for electromagnetic compatibility (in terms of emission and immunity), depending on the particular usage or environment in which they are intended to be installed or integrated.

(1) Absolute Limiting Rating

The absolute limiting (maximum and/or minimum) ratings may refer to a rating at which there is no fatal damage to a DFB-LD device when each limiting parameter is isolated and all other parameters are in a normal performance parameter, and a product is applied to such a rating for a short period of time. It may not be assumed that limiting values of two or more parameters are applicable at once.

In other words, absolute limiting (maximum and/or minimum) ratings imply that no catastrophic damage will occur if the product is subject to these ratings for short periods of time, provided each limiting parameter is in isolation and all other parameters have values within the normal performance parameters. It should not be assumed that the limiting rating values of more than one parameter can be applied at any one time.

Figure 3:
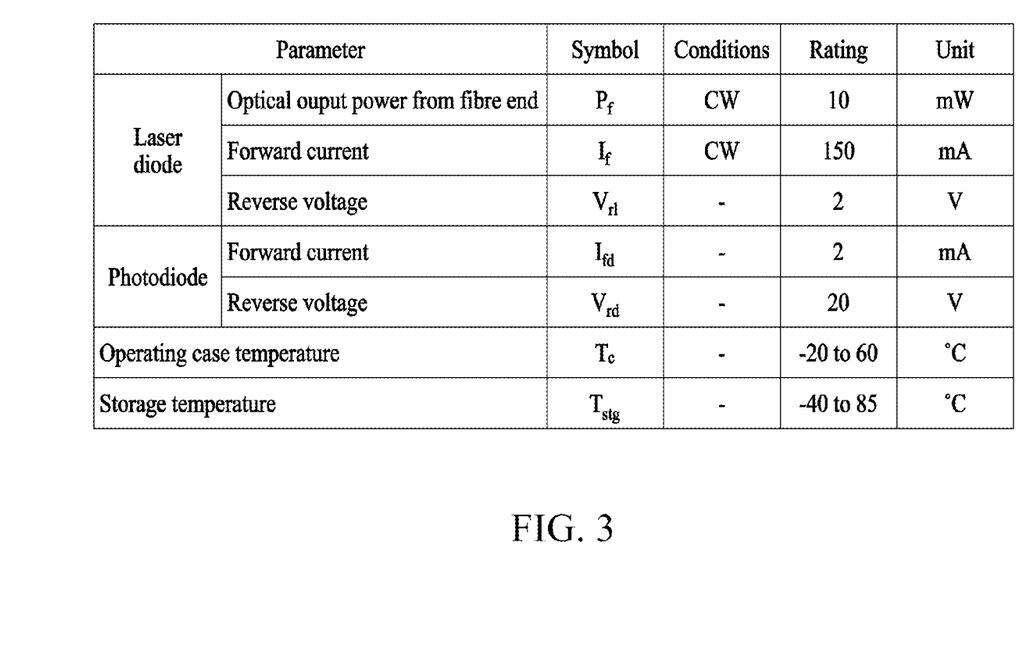
FIG. 3 illustrates an example of a parameter of an absolute limiting rating according to an example embodiment.

The absolute limiting rating may be described with parameters illustrated in FIG. 3.

(2) Operating Case Environment

Figure 4:
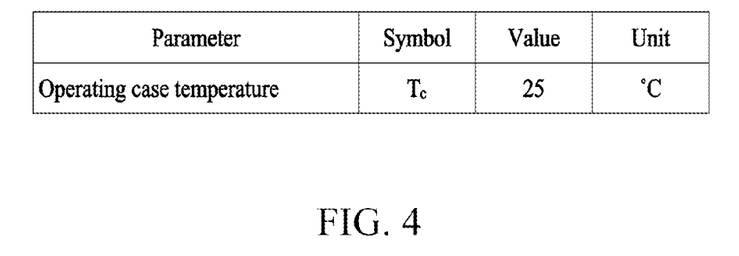
FIG. 4 illustrates an example of a parameter of an operating condition for a functional specification according to an example embodiment.

For the operating case environment, reference may be made to what is illustrated in FIG. 4.

(3) Functional Specification

Figure 5:
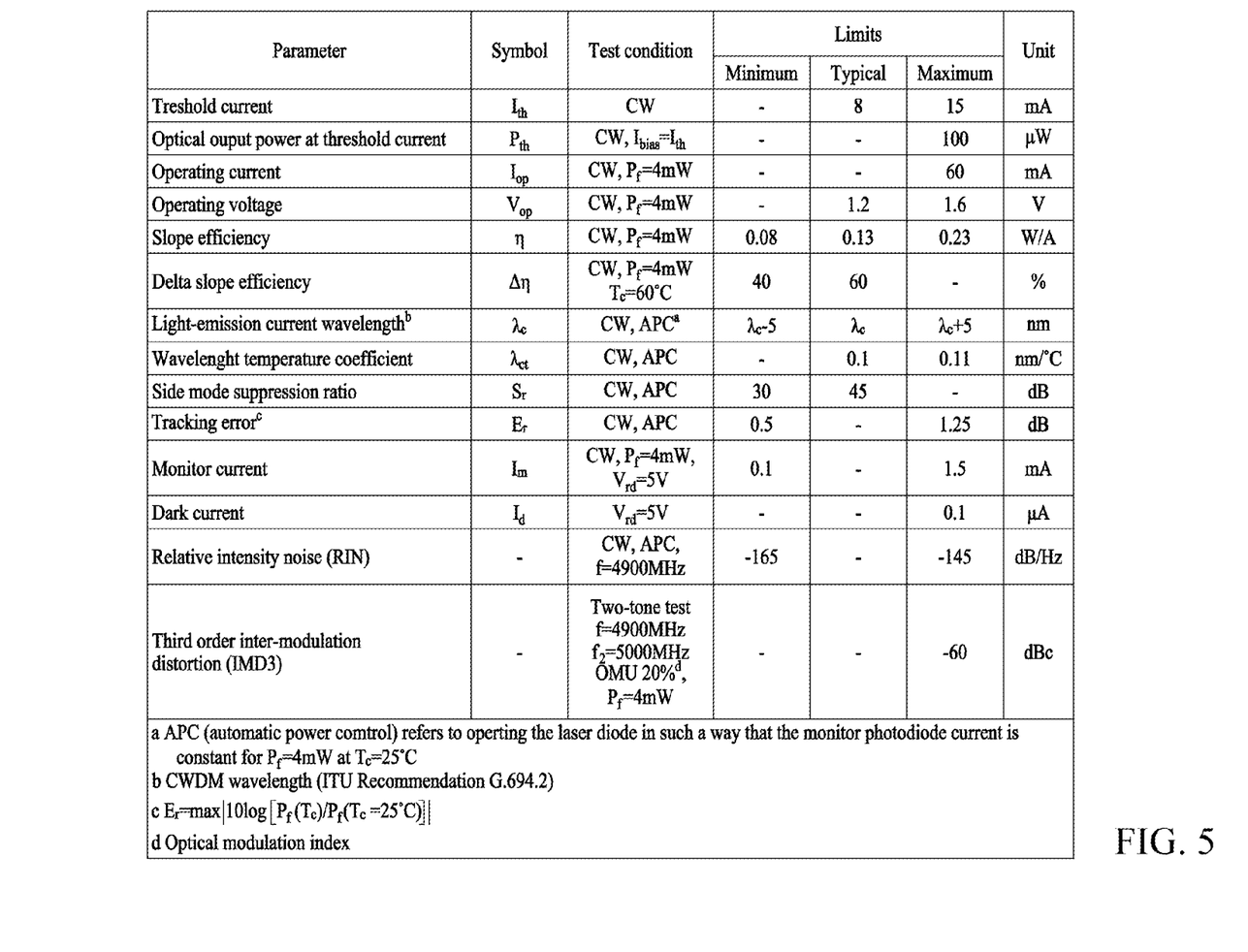
FIG. 5 illustrates an example of a parameter of a functional specification according to an example embodiment.

The functional specification is illustrated in FIG. 5. The functional specification illustrated in FIG. 5 includes an operating condition for a functional specification of a DFB-LD device for an RoF system having a monitor photodiode.

<Testing>

(1) Characterization Testing

The characterization testing has been described above.

(2) Performance Test

Figure 6:
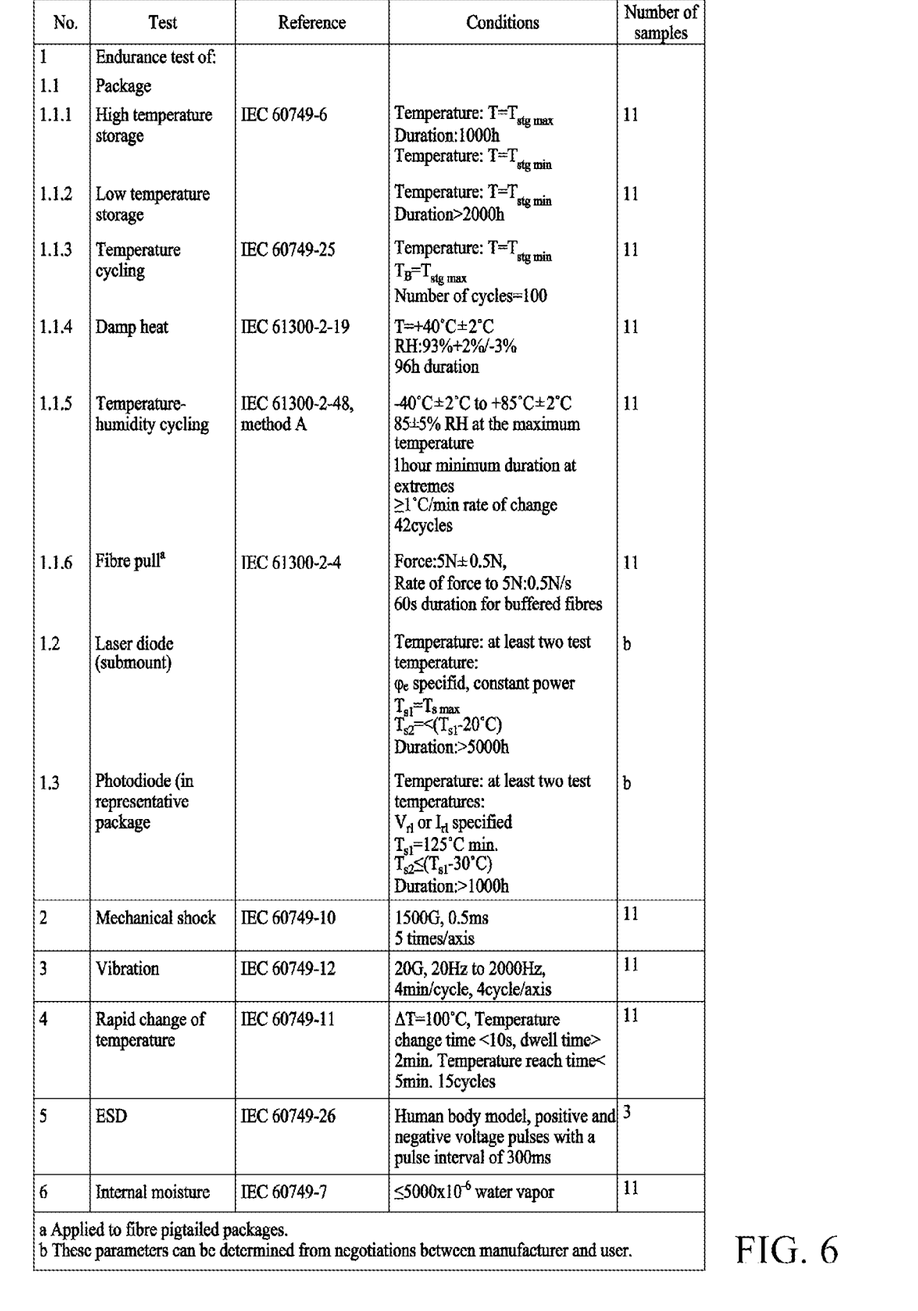
FIG. 6 illustrates an example of a procedure related to a performance test plan according to an example embodiment.
Figure 7:
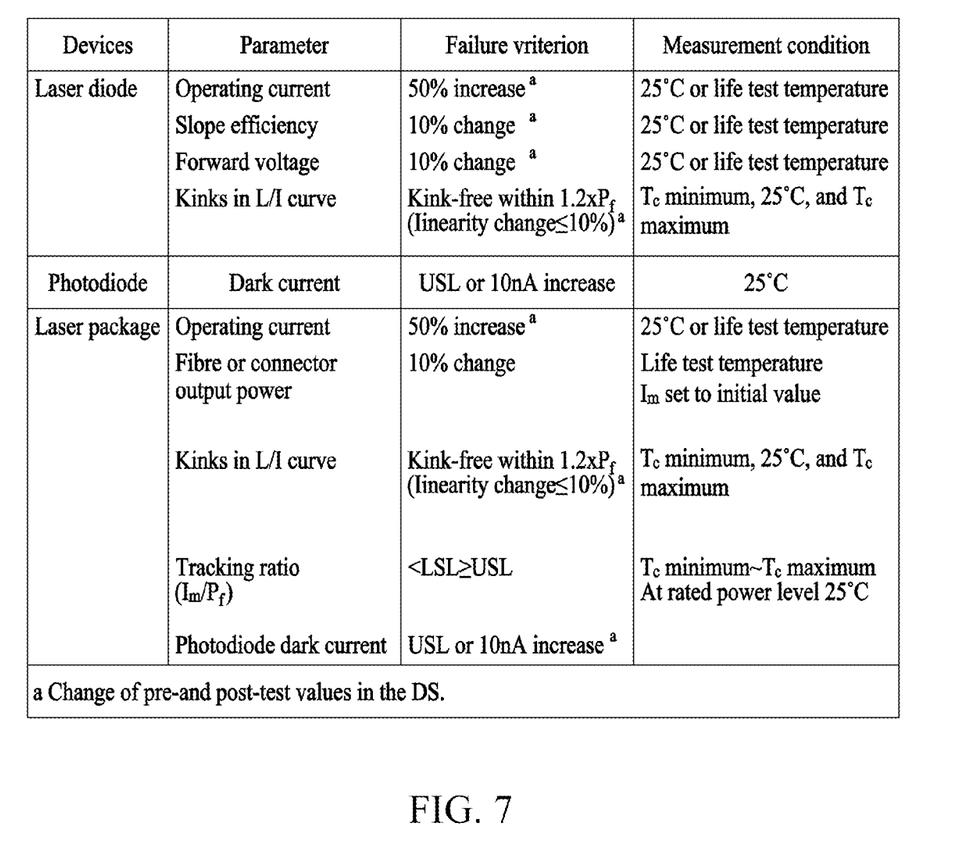
FIG. 7 illustrates an example of a performance test failure criterion according to an example embodiment.

The performance test may be performed as illustrated in FIG. 6. In addition, the criteria for a failure in the performance test are as illustrated in FIG. 7.

The apparatus and method described herein according to example embodiments may be written in a computer-executable program and may be implemented as various recording media such as magnetic storage media, optical reading media, or digital storage media.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

Various techniques described herein may be implemented in digital electronic circuitry, computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal, for processing by, or to control an operation of, a data processing apparatus, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network. Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductor memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include all computer storage media. In addition, non-transitory computer-readable media may be any available media that may be accessed by a computer and may include both computer storage media and transmission media.

Although the present disclosure includes details of a plurality of specific example embodiments, the details should not be construed as limiting any invention or a scope that can be claimed, but rather should be construed as being descriptions of features that may be peculiar to specific example embodiments of specific inventions. Specific features described in the present disclosure in the context of individual example embodiments may be combined and implemented in a single example embodiment. On the contrary, various features described in the context of a single embodiment may be implemented in a plurality of example embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In a specific case, multitasking and parallel processing may be advantageous. In addition, it should not be understood that the separation of various device components of the aforementioned example embodiments is required for all the example embodiments, and it should be understood that the aforementioned program components and apparatuses may be integrated into a single software product or packaged into multiple software products.

The example embodiments disclosed in the present disclosure and the drawings are intended merely to present specific examples in order to aid in understanding of the present disclosure, but are not intended to limit the scope of the present disclosure. It will be apparent to those skilled in the art that various modifications based on the technical spirit of the present disclosure, as well as the disclosed example embodiments, can be made.

What is claimed is:

1. A test device for testing a distributed feedback laser diode (DFB-LD) device for a radio over fiber (RoF) system, comprising:
   a computer for applying maximum and minimum limiting ratings for a plurality of parameters to the DFB-LD device during testing, wherein the parameters are applied one at a time while all other parameters are kept in a normal performance range for a preset period of time and no fatal damage to the DFD-LD occurs during the preset period of time;
   a case for subjecting the DFB-LD to a desired temperature during testing;
   the computer for applying various functional specification parameters according to an operating condition for a function specification to the DFB-LD device during testing; and
   a measuring device for measuring the DFB-LD device during testing.

2. The test device of claim 1, wherein the operating condition for the functional specification comprises a case temperature.

3. The test device of claim 1, wherein the parameters for the functional specification comprise:
   (i) a threshold current, (ii) an optical output power at the threshold current, (iii) an operating current, (iv) an operating voltage, (v) a slope efficiency, (vi) a delta slope efficiency, (vii) a light-emission current wavelength, (viii) a wavelength temperature coefficient, (ix) a side mode suppression ratio, (x) a tracking error, (xi) a monitor current, (xii) a dark current, (xiii) a relative intensity noise, and (xiv) a third-order intermodulation distortion.

4. The test device of claim 1, wherein a test plan for the DFB-LD device comprises:
   (i) a package, (ii) first temperature storage, (iii) second temperature storage, (iv) temperature cycling, (v) damp heat, (vi) temperature-humidity cycling, (vii) fiber pull, (viii) laser diode sub-mount, (ix) a photodiode in a representative package, (x) a mechanical impact, (ix) a vibration, (xii) a drastic temperature change, (xiii) an electrostatic discharge (ESD), and (xiv) an internal humidity, under which a test on the DFB-LD device is performed.

5. The test device of claim 1, wherein a laser diode of the DFB-LD device is tested according to an operating current, a slope efficiency, a forward voltage, and a kink on a light-current (L/I) curve.

6. The test device of claim 1, wherein a photodiode of the DFB-LD device is tested according to a dark current.

7. The test device of claim 1, wherein a laser package of the DFB-LD device is tested according to (i) an operating current, (ii) an output power of a fiber or connector, (iii) a kink on an L/I curve, and (iv) a photodiode dark current.

8. A test method of testing a distributed feedback laser diode (DFB-LD) device for a radio over fiber (RoF) system, the test method comprising:
   identifying the DFB-LD device;
   applying maximum and minimum limiting ratings for a plurality of parameters to the DFB-LD device during testing, wherein the parameters are applied one at a time while all other parameters are kept in a normal performance range for a preset period of time and no fatal damage to the DFD-LD occurs during the preset period of time;
   subjecting the DFB-LD to a desired temperature during testing;
   applying various functional specification parameters according to an operating condition for a function specification to the DFB-LD device during testing; and
   measuring the DFB-LD device during testing.

9. The test method of claim 8, wherein the operating condition for the functional specification comprises a case temperature.

10. The test method of claim 8, wherein parameters for the functional specification comprise:
    (i) a threshold current, (ii) an optical output power at the threshold current, (iii) an operating current, (iv) an operating voltage, (v) a slope efficiency, (vi) a delta slope efficiency, (vii) a light-emission current wavelength, (viii) a wavelength temperature coefficient, (ix) a side mode suppression ratio, (x) a tracking error, (xi) a monitor current, (xii) a dark current, (xiii) a relative intensity noise, and (xiv) a third-order intermodulation distortion.

11. The test method of claim 8, wherein a test plan for the DFB-LD device comprises:
    (i) a package, (ii) first temperature storage, (iii) second temperature storage, (iv) temperature cycling, (v) damp heat, (vi) temperature-humidity cycling, (vii) fiber full, (viii) a laser diode sub-mount, (ix) a photodiode in a representative package, (x) a mechanical impact, (xi) a vibration, (xii) a drastic temperature change, (xiii) an electrostatic discharge (ESD), and (xiv) an internal humidity, under which the test is performed.

12. The test method of claim 8, wherein a laser diode of the DFB-LD device is tested according to an operating current, a slope efficiency, a forward voltage, and a kink on a light-current (L/I) curve.

13. The test method of claim 8, wherein a photodiode of the DFB-LD device is tested according to a dark current.

14. The test method of claim 8, wherein a laser package of the DFB-LD device is tested according to (i) an operating current, (ii) an output power of a fiber or connector, (iii) a kink on an L/I curve, and (iv) a photodiode dark current.

* * * * *